United States Patent [19]
Turnbull

[11] Patent Number: 5,883,497
[45] Date of Patent: *Mar. 16, 1999

[54] BATTERY FUEL GAUGE

[75] Inventor: Robert R. Turnbull, Buchanan, Mich.

[73] Assignee: Packard Bell NEC, Sacramento, Calif.

[*] Notice: The term of this patent shall not extend beyond the expiration date of Pat. No. 5,541,490.

[21] Appl. No.: 956,618

[22] Filed: Sep. 18, 1997

Related U.S. Application Data

[63] Continuation of Ser. No. 298,769, Aug. 31, 1994, abandoned, which is a continuation of Ser. No. 975,879, Nov. 13, 1992, Pat. No. 5,629,604.

[51] Int. Cl.$^6$ ................................................ H01M 10/46
[52] U.S. Cl. ..................................... 320/132; 320/158
[58] Field of Search .................................. 320/5, 30, 39, 320/49, 48, 158, 132, 149, 148, 161, 162, 145, 152, 160, DIG. 10, 163; 340/635, 636; 429/61, 90; 324/426, 427, 433

[56] References Cited

U.S. PATENT DOCUMENTS

| | | | |
|---|---|---|---|
| 4,413,221 | 11/1983 | Banjamin et al. | 320/48 |
| 4,709,202 | 11/1987 | Koenck et al. | |
| 4,876,513 | 10/1989 | Brilmygr et al. | 320/48 X |
| 4,910,103 | 3/1990 | Yoshikawa et al. | |
| 4,918,368 | 4/1990 | Baker et al. | |
| 4,965,738 | 10/1990 | Bauer et al. | |
| 5,130,659 | 7/1992 | Sloan | 320/48 X |
| 5,150,031 | 9/1992 | James et al. | |
| 5,185,565 | 2/1993 | Uchida | |
| 5,248,929 | 9/1993 | Burke | 320/48 X |
| 5,315,228 | 5/1994 | Hess et al. | 320/31 |
| 5,325,041 | 6/1994 | Briggs | 320/48 X |
| 5,434,495 | 7/1995 | Toko | 320/48 X |
| 5,541,490 | 7/1996 | Sengupta et al. | 320/14 |

OTHER PUBLICATIONS

*Sealed Rechargeable Batteries Application Manual*, Gates Energy Products, 1989, pp. 150–162.
Millman & Halkias, "Integrated Electronics: Analog and Digital Circuits and Systems" 1972, pp. 665–667, Section 17–20.
A.C. Power Supply Model No. 55,924, Part No. 234–1098, Zenith Data Systems, Apr. 8, 1992.
234–1098 (OEA–151) Power Supply Control Code Sequence, Zenith Data Systems, Apr. 25, 1991, pp. 1–2.

*Primary Examiner*—Edward H. Tso
*Attorney, Agent, or Firm*—Fitch, Even, Tabin & Flannery

[57] ABSTRACT

A power supply system, for example, for use with a portable personal computer, includes a smart battery pack and a charging system. The smart battery pack is provided with a dedicated microcontroller for controlling the charging level of the battery charger system. In particular, the status of the battery including the voltage and temperature of the battery is applied to the microcontroller along with a signal representative of the current load demand of the computer system. The microcontroller, in turn, provides a control signal in the form of fixed frequency, variable duty cycle pulse width modulated (PWM) signal for controlling the charging level of the battery charger system. The duty cycle of the PWM signal is used to regulate the charging current supplied by the battery charger. In particular, the DC value of the PWM signal is used as a reference to control the charging current of the regulator to provide a variable output charging current with a relatively wide current range. As such, the battery charger is adapted to efficiently utilize the residual capacity of the battery charger system for optimizing charging of the battery packs during all operating conditions of the computer system. Moreover, the use of a PWM signal from the battery pack to control the battery charger enables a single type of battery charger to be utilized for various battery technologies.

27 Claims, 14 Drawing Sheets

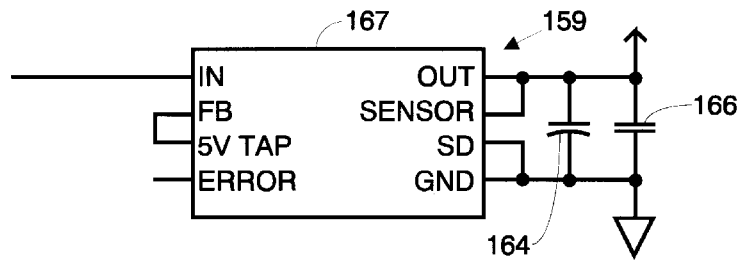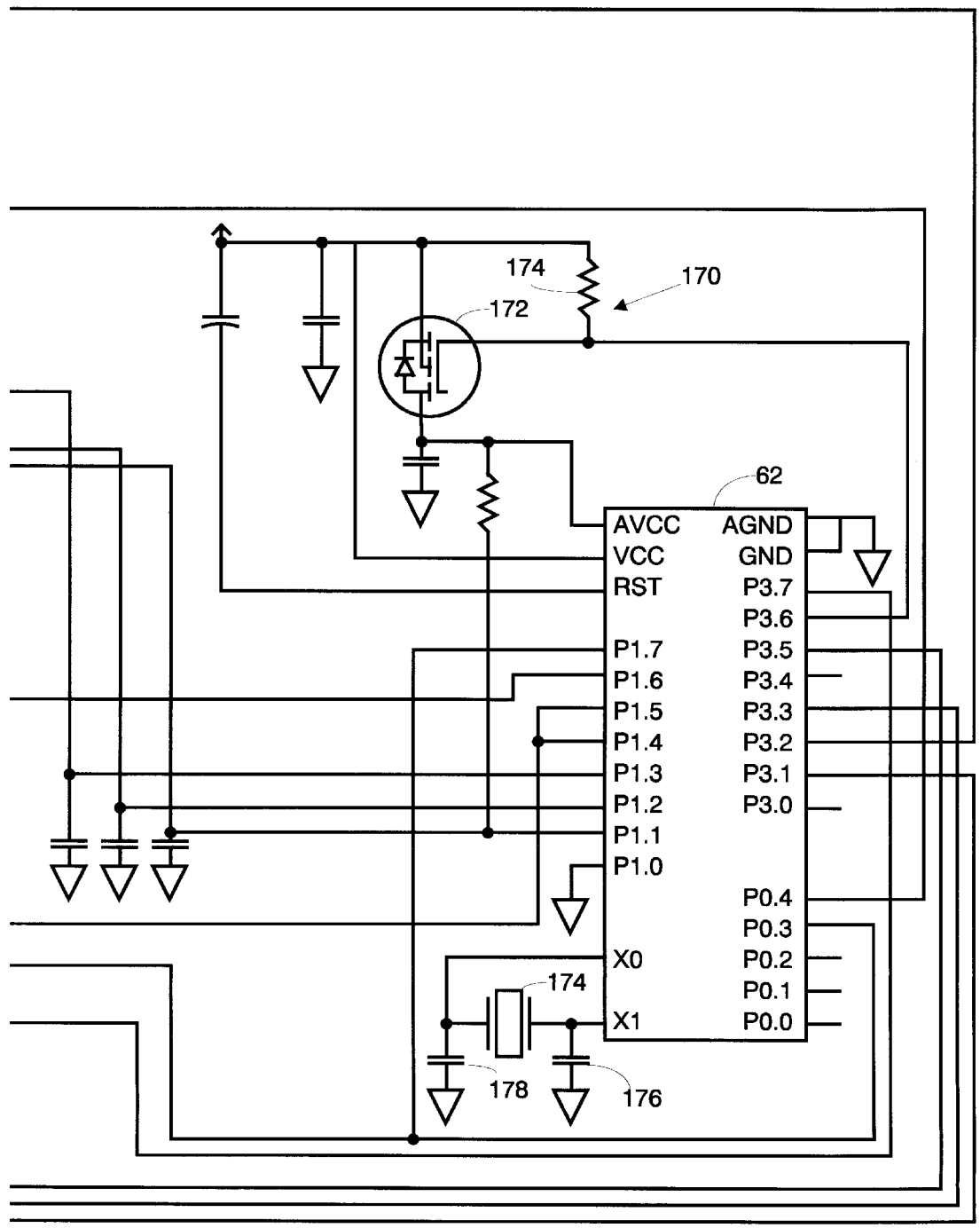
Fig. 5B

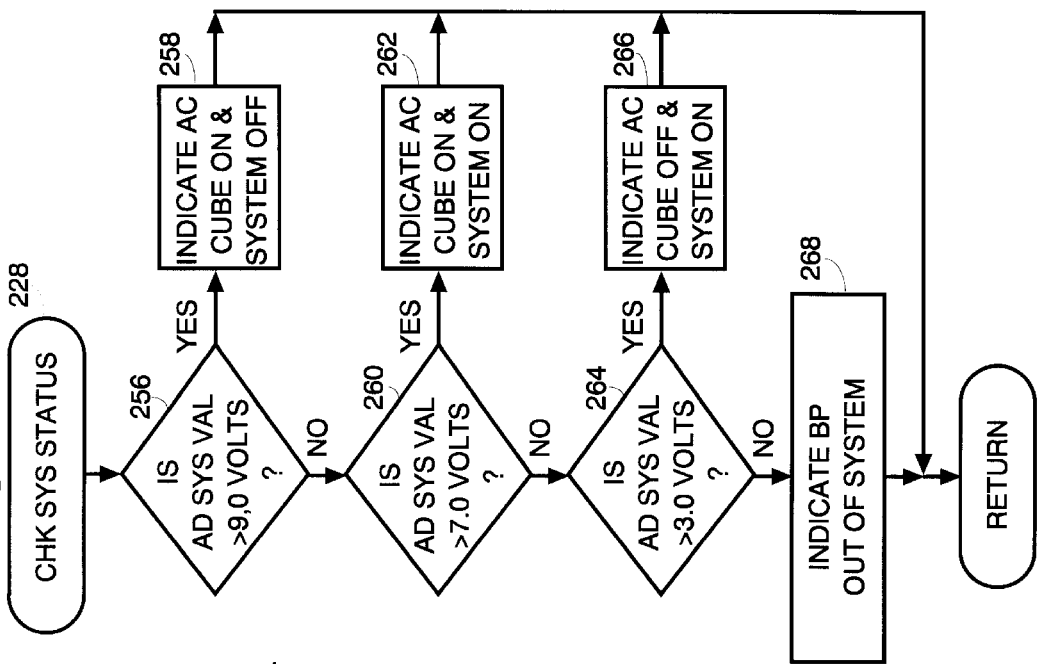
Fig. 11
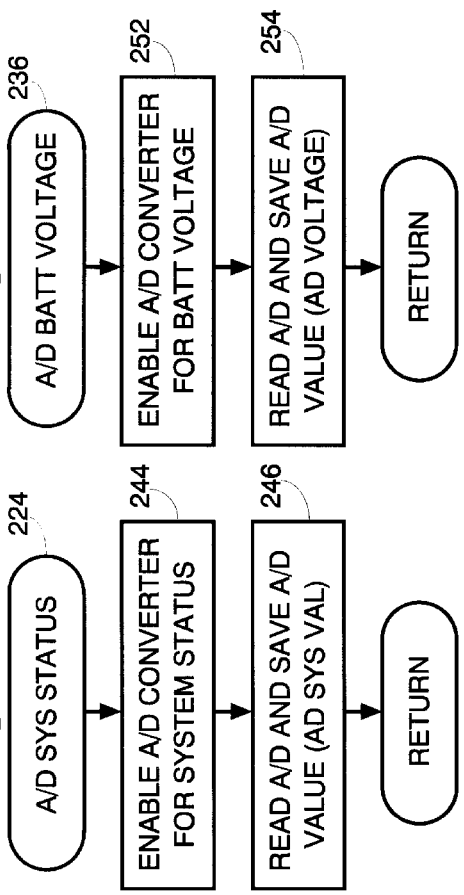
Fig. 10
Fig. 8
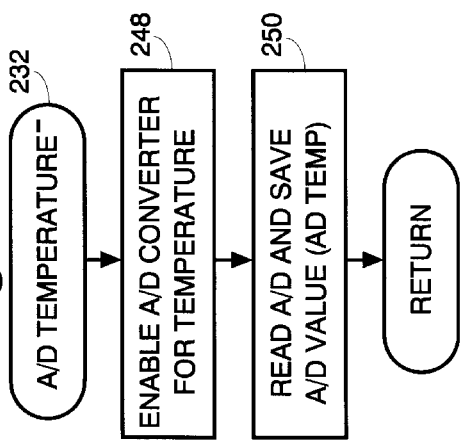
Fig. 9

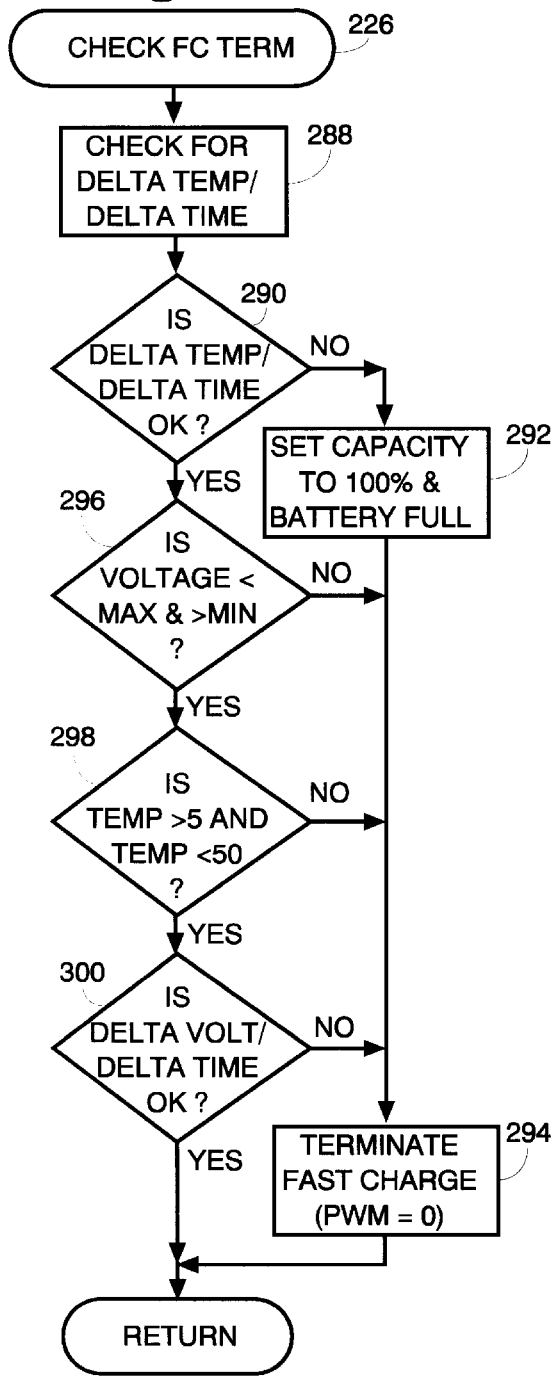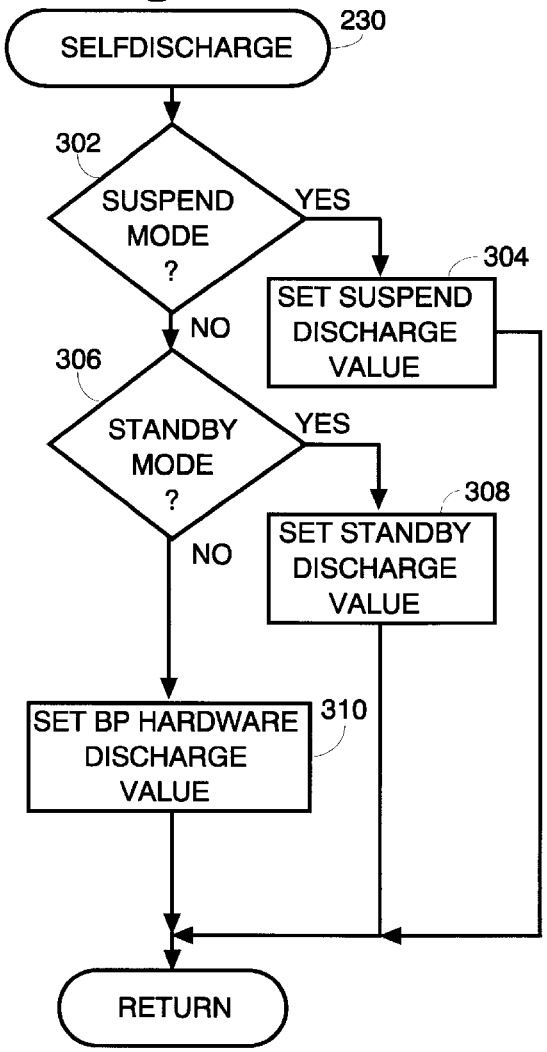

BATTERY FUEL GAUGE

This application is a continuation of application Ser. No. 08/298,769 filed Aug. 31, 1994 now abandoned which is a continuation of application Ser. No. 07/975,879, filed Nov. 13, 1992 now U.S. Pat. No. 5,629,604.

BACKGROUND OF THE INVENTION

1. Technical Field

The present invention relates to a computer power supply system and, more particularly, to a computer power supply system which includes a smart battery pack and a variable output battery charger system which enables optimal charging of the battery pack during all operating conditions while allowing the power supply to be utilized with battery packs having different charging characteristics.

2. Description of the Prior Art

Power supply systems are generally known in the art. Such systems are utilized in a variety of applications to provide electrical power to portable devices, such as portable personal computers. Such power supply systems normally include a battery pack and a battery charger system. The battery charger systems are used to charge the battery packs and to enable a computer or other portable device to be operated from a source of AC electrical power. The battery pack normally provides several hours of portable operation before requiring recharging.

Various types of batteries are known. More particularly, nickel cadmium (NiCd) and nickel-metal hydride (NiMH) batteries have been known to be used in applications for portable personal computers. Such batteries generally provide a few hours of operation before requiring recharging. The charging characteristics of such batteries enable such batteries to be recharged by relatively simple battery chargers having two fixed modes of operation: a trickle charge mode and a fast charge mode. In the trickle charge mode, the battery charger provides a relatively low level constant current (e.g., 100 milliamperes) to the battery over a relatively long time, for example ten to twelve hours. In a fast charge mode, a relatively higher current level (e.g., 2 amperes) is applied to the battery over a relatively shorter period of time, for example one to three hours. In order to prevent damage to the batteries, the charge level of the batteries is continuously sensed. When the battery reaches its maximum charge level, the battery charging is terminated in order to prevent overheating and damage of the batteries.

Various systems are known for implementing a battery pack and battery charger in a portable personal computer. The degree of integration of the power supply system with the computer system varies. In one known system, a system control processor (SCP) is used to measure the charge level of the battery as well as the operational status (e.g., on-off) of the computer. In particular, signals representative of the battery voltage and temperature as well as the on-off status of the computer system are applied to the SCP which, in turn, provides a logic level signal to control the battery charger. Depending on the level of charge of the battery and the on-off status of the computer system, the SCP enables either a fast charge for a relatively short time or a trickle charge for a relatively longer time in order to charge the battery.

There are several problems associated with such a system. First, any changes to a battery technology having different charging characteristics or changes in battery capacity require some redesign of the computer system and redesign of the battery charger. Second, utilizing the SCP to monitor the charge level of the battery pack and the operating status of the computer system places an additional burden on the SCP; normally used to provide a communication between the keyboard and the central processing unit.

In an alternate known embodiment, the battery charger and battery pack have known to be provided as independent modules, disposed in separate enclosures relative to the computer system. In such an application, either one or both of the modules are adapted to be connected to the computer system at one time. This enables the computer system to be operated from either the battery pack or the battery charger. Such an application also allows the battery pack and battery charger module to be connected to the computer system at the same time, thus enabling batteries to be charged while the battery charger is operating the computer system. Moreover, the system also enables the battery charger to be used to charge the battery pack separately from the computer system.

In order to alleviate the burden on the SCP, a dedicated microprocessor is used in the alternate embodiment to monitor the charge level of the battery and the operating status of the computer system in order to control a two-level battery charging system as discussed above. The dedicated microprocessor is located in the housing with the battery charger. However, even though such a dedicated microprocessor alleviates the burden on the SCP, any change in the battery technology to one having different charging characteristics or changes in the battery capacity still requires a design change of the battery charger, thus making such changes of battery technology or capacity relatively costly to a computer manufacturer.

In another known alternate embodiment, in an attempt to improve the modularity of the system, a dedicated microprocessor is disposed in the battery pack to enable the battery pack to be more of a stand-alone subsystem. Such a system provides the ability to upgrade to a different type of battery pack having similar charge/discharge characteristics.

However, the above mentioned system as well as the other systems discussed above utilize battery chargers that provide fixed level current charging to the battery pack. More particularly, whether controlled from the SCP or from a dedicated processor, the battery chargers discussed above are known to operate in two fixed current modes; namely, a fast charge mode and a trickle charge mode. Although such charging characteristics are suitable for nickel cadmium batteries and other types of batteries, such charging characteristics may not be suitable for new battery technologies which have recently become available that provide for higher energy density. Such new battery technologies may require different charging characteristics which could not be provided by the known battery charging systems discussed above. For example, new battery technologies may be less tolerant of continuous overcharge in order to maintain the battery at full capacity in contradistinction to nickel cadmium batteries. In addition, the fixed two-level charge characteristics of known battery chargers may not be suitable because of the capacity rating (the fast charge current may be too high or too low). With such new battery technologies, the battery charging circuit has to be redesigned for each different battery technology used.

Another problem with such known power supply systems is the inability of such systems to efficiently utilize the capacity of the battery charger. This inability is based on the failure of such known systems to detect the current load demand placed on the AC power supply battery charger by the computer system. In such systems, a worst-case design approach is known to be used which inhibits fast charging of the battery pack while the computer system is operational in order to avoid exceeding the capacity of the battery charger. In particular, in order to keep the cost and the weight of the system down, the battery charger capacity is known to be sized based on an estimate of the maximum load demand of the computer system. However, it is known that during the majority of time, the computer system is not operating at maximum load. Thus, with known power supply systems, fast charging of the battery pack is inhibited during the majority of time, thereby utilizing only a fraction of the available capacity of the battery charger. Thus, during such periods when the computer system is not operating at maximum load, a surplus or residual capacity of the battery charger is idle instead of being used to charge the battery pack at other than a trickle charge rate.

SUMMARY OF THE INVENTION

It is an object of the present invention to solve various problems relating to computer power supply systems that exist in the art.

It is yet another object of the present invention to provide a smart battery pack that includes a control circuit for controlling the charging rate at which the battery is charged.

It is yet a further object of the present invention to provide a battery charging system that is adapted to be used with different types of batteries having different charging characteristics.

It is another object of the present invention to provide a battery charging system, adapted to provide a variable output, selectable from a relatively wide current range.

It is yet another object of the present invention to utilize surplus capacity of the battery charger system to charge the battery pack at other than a trickle charge rate while the computer system is operational.

BRIEF DESCRIPTION OF THE DRAWING

These and other objects of the present invention will be readily understood with reference to the specification and accompanying drawing, wherein:

FIGS. 5A and 5B represent exemplary schematic diagrams of the smart battery pack illustrated in FIG. 2;

FIGS. 7–19 are flow diagrams for the power supply system in accordance with the present invention.

DETAILED DESCRIPTION OF THE PREFERRED EMBODIMENT

Figure 1:
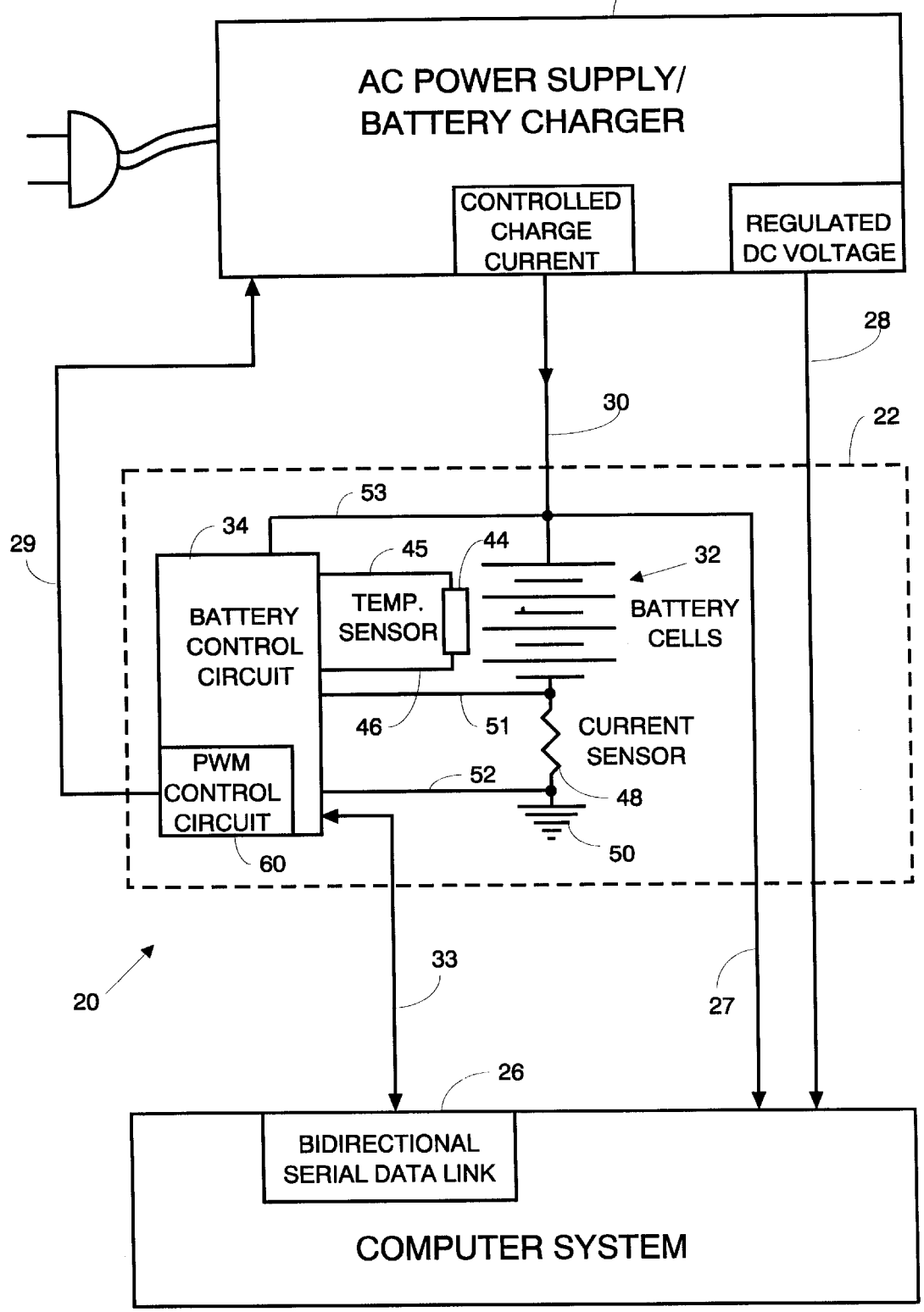
FIG. 1 is a block diagram of a power supply system in accordance with the present invention.

As will be apparent to those of ordinary skill in the art, the power supply system in accordance with the present invention provides several advantages over known power supply systems thus making it suitable for portable personal computers. In particular, the power supply system in accordance with the present invention improves the interchangeability of system components. More specifically, the system allows a standard or generic battery charger system to be utilized with various battery technologies having different capacities and/or different charging characteristics. Another benefit of the invention is that it enables more effective use of the capacity of the battery charger. More particularly, the system in accordance with the present invention takes advantage of the full capacity of the power supply by monitoring the load placed on the system by the computer system. By sensing the load placed on the charger by the computer system, the battery pack can be optimally charged under all conditions. For example, under typical conditions, a known portable personal computer might require 6 watts to operate while the battery pack might require 14 watts for fast charge and 1 watt for a trickle charge. Assuming the battery charger system has a capacity of 20 watts, the battery charger system in such an application can simultaneously fast charge the batteries and operate the computer system. Under worst case loading conditions, the computer system might draw up to 16 watts of power, leaving 4 watts for charging the battery pack even though the computer system is operating at maximum load. Because the charge current in the system 20 can be set to intermediate values between the maximum (fast charge) and minimum (trickle charge), the residual capacity of the battery charger system can be utilized to charge the battery pack 22 during such a worst case loading system at other than a trickle charge (e.g., 1 watt) as in known systems.

Referring to FIG. 1, the power supply system in accordance with the present invention, generally identified with the reference numeral 20, includes a smart battery pack, shown within the dashed box 22, and a battery charger 24. The smart battery pack 22 and battery charger 24 form the power supply system 20 for use with a portable electrical load, such as a portable personal computer 26, to enable two modes of operation: a battery mode and an AC mode. During a battery mode, the computer system 26 is powered by the battery along line 27. During an AC mode, a source of regulated DC voltage is supplied by the battery charger 24 to the computer system 26 along line 28 to enable the computer system 26 to be powered from the battery charger 24 while at the same time charging the battery pack 22. The level of charging current applied to the battery pack 22 over line 30 is controlled by a battery control circuit 34 along line 29. A source of controlled charge current is supplied to the battery pack 22 along line 30 which enables the battery pack 22 to be optimally charged during all operating conditions of the computer system 26. A bi-directional data link 33 is utilized to provide communication between the battery pack 22 and the computer system 26. For example, as will be discussed in more detail below, the battery pack 22 initiates an INHIBIT signal to the computer system 26 when the battery level is relatively low to inhibit operation of the computer system 26 in order to avoid damage to the battery pack 22. Additionally, the serial data link 33 may be used to provide the current battery charge status to the computer system 26.

As shown in FIG. 1, the smart battery pack 22 includes a plurality of battery cells 32 for providing a portable electrical power supply and an internal battery control circuit 34, as well as circuitry for sensing the load demand of the computer system 26 as well as the temperature and voltage of the battery cells 32. In particular, a temperature sensor 44, such as a thermistor, is applied to the battery control circuit 34 along lines 45 and 46. The temperature sensor 44 is used to sense the temperature of the battery pack 22 in order to avoid overheating and damage. The load and charging current to and from the battery cells 32 is sensed by a current sensing resistor 48, serially connected between a negative terminal of the battery cells 32 and system ground 50. The voltage across the current sensing resistor 48 is applied to the battery control circuit 34 along lines 51 and 52. The battery voltage, which represents the charge level of the battery cells 32, is sensed by connecting the positive and negative terminals of the battery cell 32 to the battery control circuit 34 along lines 51 and 53. As will be discussed in more detail below, the battery control circuit 34 regulates the amount of charging current applied to the battery 32 over line 30.

Figure 2:
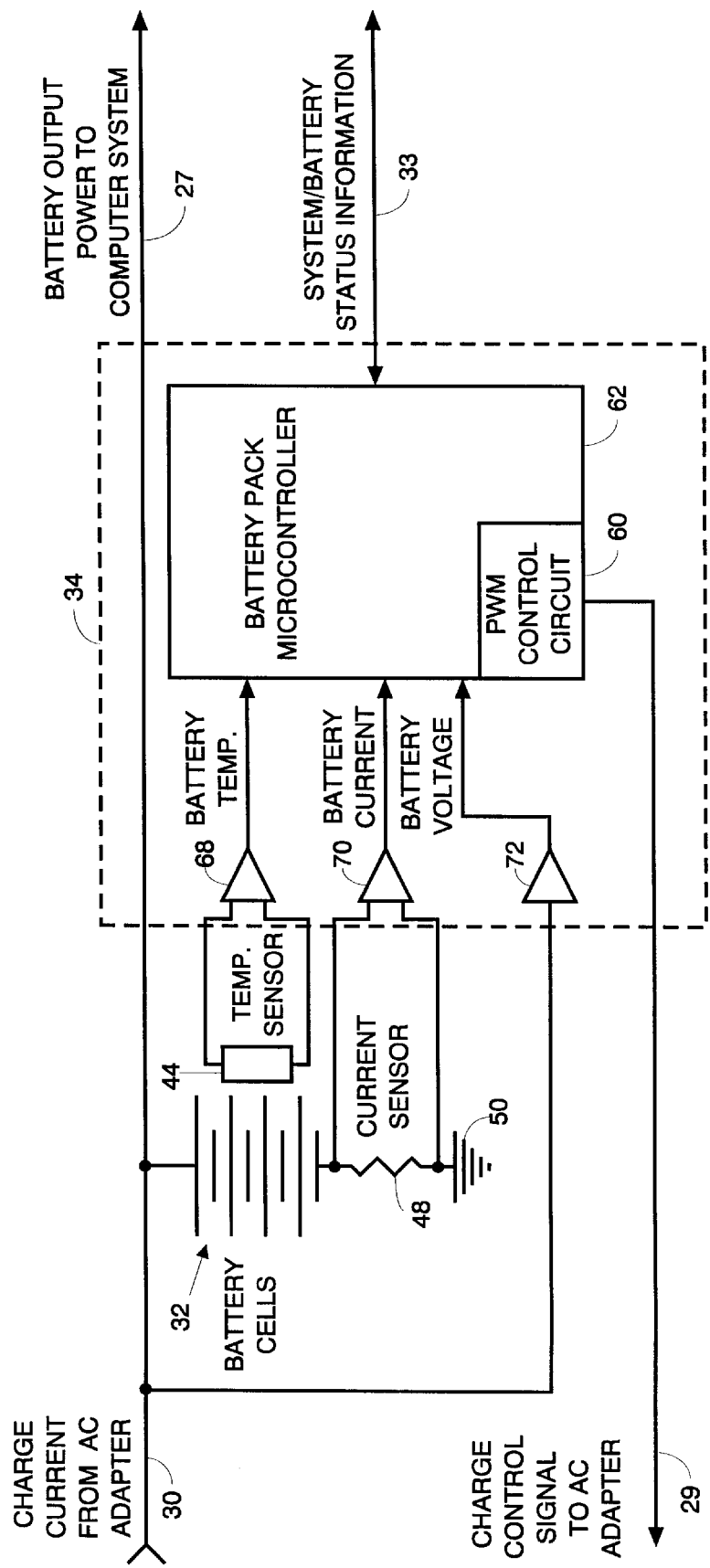
FIG. 2 is a block diagram of a smart battery pack in accordance with the present invention.

In order to regulate the charging current from the battery charger 24, the battery control circuit 34 in accordance with the present invention outputs a fixed frequency, variable duty cycle pulse train. More particularly, the battery control circuit 34 includes a PWM control circuit 60 that is adapted to provide a pulse width modulated (PWM) control signal along line 29 to the battery charger 24. The duty cycle of the PWM signal is used to modulate the charging current from the battery charger 24 along line 30. As better shown in FIG. 2, the PWM circuit 60 is provided within a microcontroller 62, having an onboard PWM circuit 60, such as a Signetics Model 87C752. For simplicity, the battery control circuit 34, shown in FIG. 2 also illustrates a plurality of control circuits 68, 70 and 72, as will be discussed in more detail below, (represented as operational amplifiers in FIG. 2 for simplicity) for conditioning the signals from the temperature sensor 44, current sensor 48 and the voltage across the battery cells 32, respectively.

Figure 3:
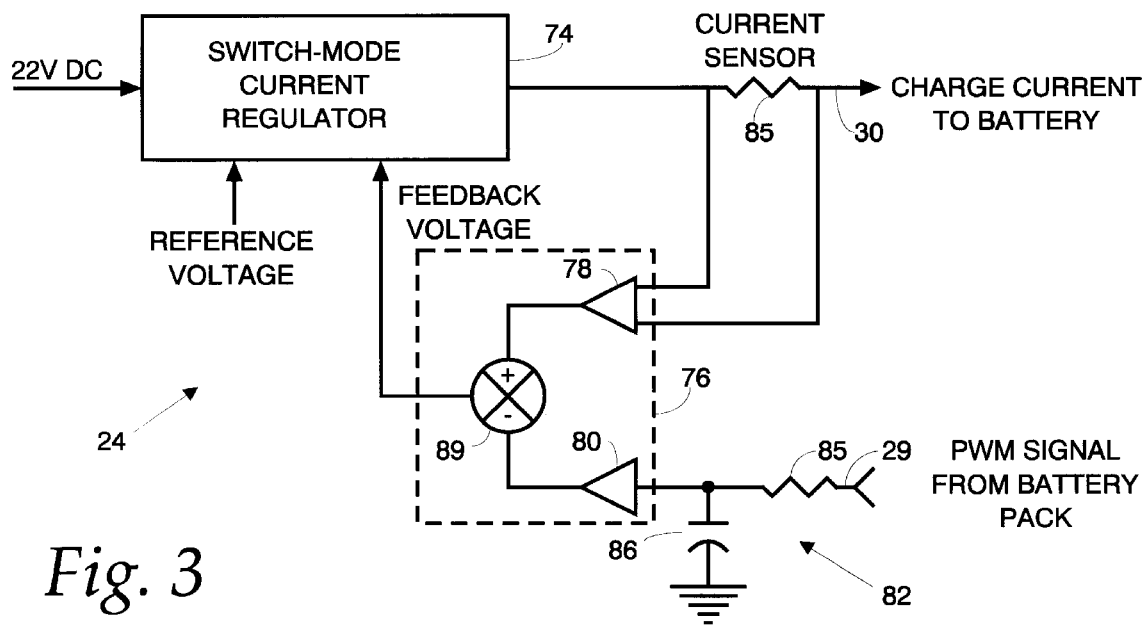
FIG. 3 is a block diagram of a battery charging system in accordance with the present invention.

The battery charger system 24, shown in FIG. 3, includes a switching mode current regulator 74 and a feedback circuit, shown within the dashed box 76. The feedback circuit 76 includes a pair of operational amplifiers 78 and 80 and a summing junction 84. A current sensing resistor 85 provides the feedback circuit 76 with an indication of the present charging current applied to the smart battery pack 22 along line 30. In particular, the voltage across the current sensing resistor 85 is applied to the operational amplifier 78. The output of the operational amplifier 78, in turn, is applied to a positive input of the summing junction 84. The PWM signal along line 29 from the battery control circuit 34 is applied to a low pass filter 82, which includes a resistor 87 and a capacitor 86. The low pass filter 82 is used to provide the DC value of the signal on line 29 that is proportional to the duty cycle of the PWM signal. The output of the low pass filter 82, in turn, is applied to the operational amplifier 80 whose output is applied to a negative input of the summing junction 84. The output of the summing junction 84 thus represents a feedback voltage which, in turn, is used to control the charging current from the switch mode current regulator 74 according to the charge load of the battery cells 32 and the residual capacity of the charger system 24.

The PWM signal from the smart battery pack 22 provides several advantages. First, it provides a variable feedback signal to enable the output current from the regulator 74 to be regulated between its minimum and maximum limits. Second, a PWM-type signal obviates the need for an analog-to-digital converter. Third, low cost micro-controllers, such as the microcontroller 62, generally include a PWM output signal. Accordingly, the use of a PWM signal for regulating the charger system 24 allows the charging current along line 30 to be regulated without adding cost or hardware to the overall system.

Figure 4:
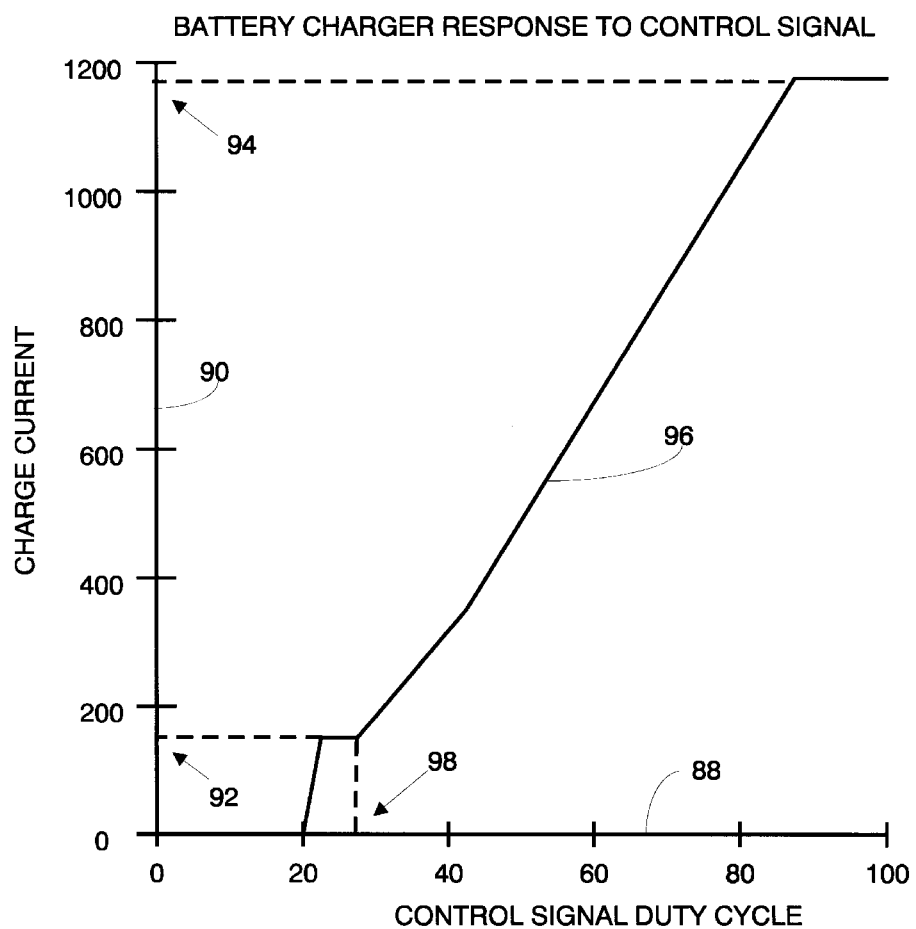
FIG. 4 is a graphical representation of the charging current supplied by the battery charger in accordance with the present invention as a function of the duty cycle of the control signal from the battery pack.

FIG. 4 represents an graphical illustration of the PWM signal duty cycle as a function of charge current in milliamperes of an exemplary system. In particular, the horizontal axis 88 is representative of the duty cycle of the PWM control signal, while the vertical axis 90 is representative of the charging current provided by the battery charger 24 along line 30 in milliamperes. The minimum and maximum limits of the charging current are illustrated by the points 92 and 94, respectively, in FIG. 4. In particular, above a threshold duty cycle value, the system can provide a variable charging current, as indicated by the curve 96, that is continuously variable throughout a relatively wide range of duty cycles from a threshold duty cycle as indicated by the point 98 on the horizontal axis 88 to 100% duty cycle. As such, the system in accordance with the present invention is adapted to provide a variable charging current to the smart battery pack 22 in order to provide optimal charging of the battery pack 22 during all operating conditions of the computer system 26.

Figure 5A:
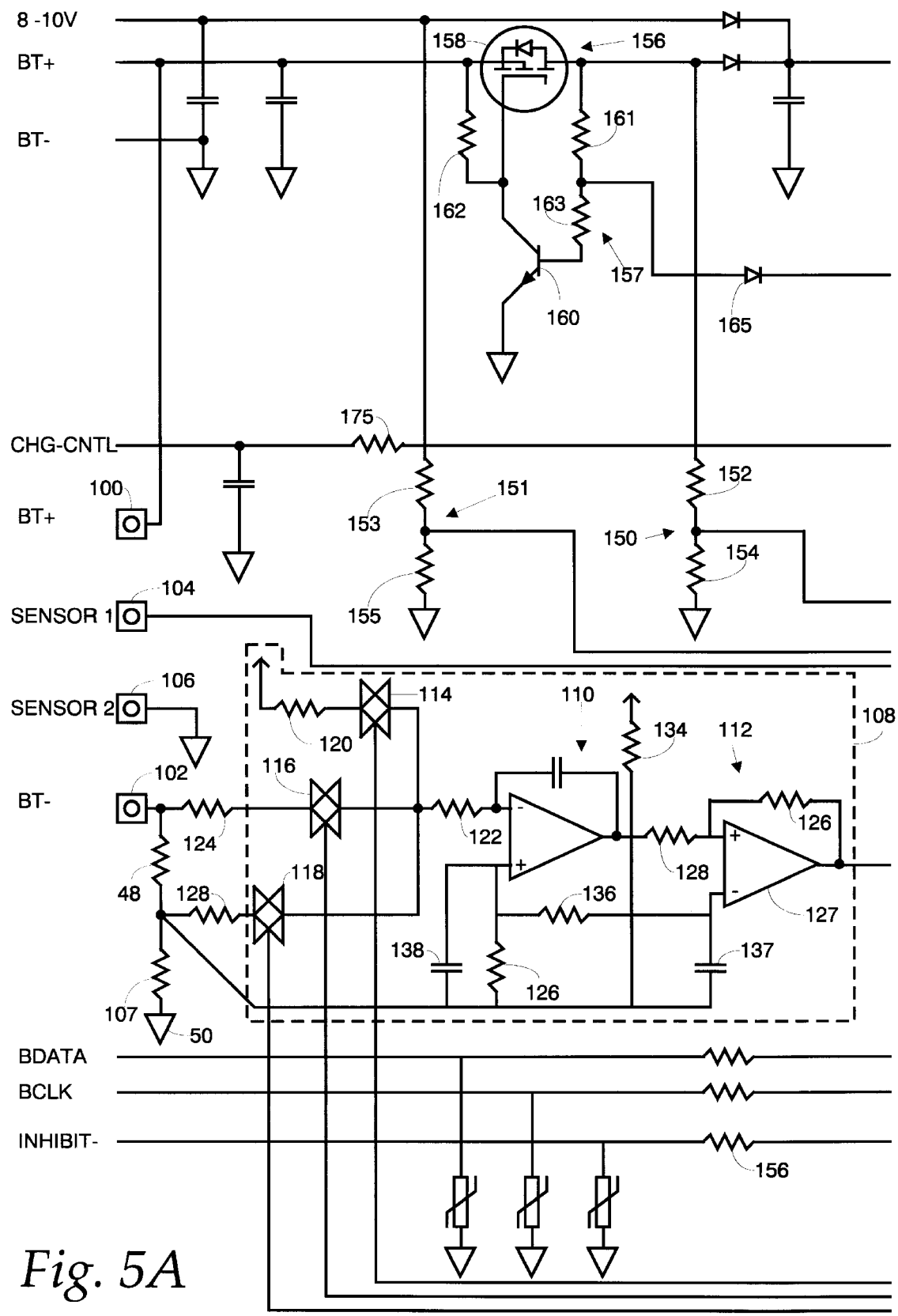

An exemplary schematic diagram of the smart battery pack 22 is illustrated in FIGS. 5A and 5B. The battery cells 32 are adapted to be connected across the terminals 100 and 102, while the temperature sensor 44 is connected across the terminals 104 and 106. The line 30 from the battery charger system 24 (FIG. 1) is also connected to the terminal 100. As mentioned above, the charging current to and load current from the battery cells 32 is sensed by the current sensing resistor 48, serially connected between a negative terminal BT− of the battery cell 32 and system ground by way of a current limiting resistor 107. The voltage drop across the current sensing resistor 48 is applied to the microcontroller 62 by way of an analog-to-digital converter (ADC). The ADC is formed as a dual-slope ADC and includes the circuitry shown within the dashed box 108. In particular, the circuitry within the dashed box 108 includes an integrator, generally identified with the reference numeral 110, a comparator 112 and three solid state switches 114, 116 and 118. In general, the ADC functions by integrating the unknown voltage across the current sensing resistor 48 for a fixed time period and then integrating a known voltage of opposite polarity until the integrator 110 is reset. The amount of time required to reset the integrator 110 is proportional to the voltage across the current sensing resistor 48. In particular, since the ratio of the reference voltage to the integration time of the reference voltage is constant, the integration time proportional to the voltage drop across current sensing resistor 48 and, in turn, the current flowing therethrough.

The solid state switches 114, 116 and 118 enable the current sensing resistor 48 as well as a reference voltage to be connected and disconnected from the integrator 110. These solid state switches 114, 116 and 118 are under the control of the microcontroller 62. The solid state switch 114 is used to connect a reference voltage to the integrator 110 by way of the input resistors 120 and 122. The solid state switch 116 is adapted to connect one side of the current sensing resistor 48 to an inverting input of the integrator 110 by way of the input resistor 122 and an input resistor 124. The other side of the current sensing resistor 48 is connected to a non-inverting input of the integrator 110 by way of another resistor 126. The integrator 110 discharge path is controlled by way of the solid state switch 118 which connects the inverting input of the integrator 110 to system ground 50 by way of the resistors 107 and 122 as well as a resistor 128.

In order to provide for a single power supply operation of the ADC, the non-inverting input of the integrator 110 is offset by a predetermined value, for example 100 mv. The value of the offset voltage is selected to be greater than the largest voltage drop across the current sensing resistor 48. As such, all input voltages will be negative with respect to the non-inverting input of integrator 110 to ensure that the integrator 110 output will always be positive.

The offset voltage, applied to the non-inverting input of the integrator 110, is developed by way of a voltage divider network that includes resistors 134 and 136 as well as the resistor 126, connected to a reference voltage, such as VCC. A bypass capacitor 138 is also connected to the non-inverting input of the integrator 110 in parallel with the resistor 126.

The output of the integrator 110 is applied to the comparator circuit 112 which includes the comparator 127, a feedback resistor 126 and an input resistor 128. The feedback resistor 126 in the comparator circuit 112 adds a small amount of hysteresis to enable faster switching of the comparator 127. The output of the integrator 110 is applied to a non-inverting input of the comparator 127 by way of the input resistor 128. In order to compensate for offset voltages in the operational amplifiers used for the integrator circuit 110, a reference voltage is applied to the inverting input of the comparator 127. The reference voltage developed by the resistors 126 and a resistor 136. These resistors 126 and 136 provide a reference value, for example 220 mv, to compensate for the off-set that prevents the integrator 110 from integrating to zero. A bypass capacitor 137 is used to couple the inverting input of the comparator 127 to system ground 50.

In operation, the ADC 108 is initialized by connecting the inverting terminal of the integrator 110 to system ground 50 for a predetermined time period, for example 2 seconds, and then opened by way of the switch 118, in order to cause the output of the integrator 110 to rise. Subsequently, the switch 114 is closed and connects a reference voltage to the integrator 110 by way of the resistor 120 and 122. This causes the output of the integrator 110 to ramp down to a zero crossing reference voltage which, in turn, causes the comparator circuit 112 output to switch. The time period between closing of the switch 114 and the switching of the comparator circuit 112 is measured by the microcontroller 62. This time period corresponds to a zero volt input and is used to compensate for the offset in the integrator 110. The zero volt input time determination is performed initially and occasionally afterward to compensate for offset voltage drift of the integrator 110. After the offset time period is determined, the switch 116 is closed for a predetermined time period, for example 2 seconds, and then opened in order to cause the integrator output voltage to ramp up. The switch 114 is then closed again to cause the reference voltage to be connected to the integrator 110. The switch 114 is closed until the integrator output voltage ramps down to the zero crossing reference voltage, which causes the comparator circuit 112 to switch. The time period between the closing of the switch 114 and the switching of the comparator circuit 112 corresponds to the voltage across the current sensing resistor 48 plus the zero offset. This time period is subtracted from the zero volt input time determined above to provide a signal directly proportional to the voltage across the current sensing resistor 48. A negative result indicates that the voltage across the current sensing resistor was negative while a positive result indicates that the voltage across the current sensing resistor 48 was positive.

As mentioned above, the ADC 108 utilizes the timing function of the microcontroller 62. Thus, the comparator circuit 112 output is connected to an interrupt port on the microcontroller 62. In addition, the microcontroller 62 is further utilized to control the solid state switches 114, 116 and 118 in the manner discussed above. In particular, the control terminals of the switches 114, 116 and 118 are connected to I/O ports of the microcontroller which provide logic level signals to the control terminals to cause the switches 114, 116 and 118 to open and close in the sequence discussed above.

As mentioned above, the battery voltage is also sensed and used to control the charging current provided by the battery charger 24. In particular, the positive battery terminal BT+ is applied to on-board ADC port on the microcontroller 62 by way of a voltage divider circuit 150, which includes serially coupled resistors 152 and 154. Additionally, the system status is sensed and applied to another ADC port on the microcontroller 62. In particular, the system status 8–10 V is applied to the microcontroller 62 by way of another voltage divider network 151 which includes the resistors 153 and 155.

The system status line 8–10 V is available from the computer system 26 and indicates by way of its voltage level, the status of the system. In particular, the system status line outputs four different voltage levels on line 8–10 V, 10 V, 8 V, 5 V, 0 V as a function of the status. The 10 V signal is used to represent the battery charger system 24 is connected to the computer system 26 and the computer system 26 is off which represents a condition whereby the battery cells 32 can be charged utilizing the full capacity of the charger system 24. The 8 V signal is used to represent that the battery charger system 24 is connected and the computer system 26 is on. The 5 V signal is used to indicate that the computer system 26 is on and being powered by the battery pack 22. The 0 V signal is used to represent various status, such as no battery charger 24 and no computer 26 connected to the battery pack 22. These signals are used to control the charging current applied to the battery pack 22.

In order to prevent damage to the battery cells 32 during relatively low charge conditions, the battery voltage is monitored. When the level falls below a predetermined value, an INHIBIT signal is initiated to shut down the computer system 26. The INHIBIT signal is available at an output port of the microcontroller 62 and applied to the computer system 26 by way of a resistor 156. In addition, a switching circuit 156, coupled between the voltage divider circuit 157 and the positive battery terminal BT+ is used to disconnect the circuit during conditions when the battery charge is relatively low to avoid damage to the battery cells 32. The switching circuit includes transistors 158 and 160, a resistors 161, 162 and 163 and a diode 165. In particular, the transistor 158 is serially coupled between the positive battery terminal BT+ and a voltage regulator circuit 159. The voltage regulator circuit includes a National Semiconductor Model LP2951 voltage regulator 167 and capacitors 164 and 166 and is used to provide a regulated 5 volt supply to the microcontroller 62. In the event that the charge level on the battery cells 32 is extremely low, the transistor 158 functions to disconnect the battery cells 32 from the system in order to avoid damaging the battery cells 32. In particular, the switching transistor 158 is a P-channel MOSFET that is on when the gate voltage is low. The transistor 160 is initially turned on by the line 8–10 V which, in turn, connects the gate of the MOSFET 158 to system ground 50, thus latching the MOSFET 158. The resistor 162 functions as a pull-up resistor for the transistor 160.

The switching transistor 158 can also be controlled by the microcontroller 62. In particular, the base terminal of the transistor 160 can be pulled low by the microcontroller 62. This low is applied to the cathode of the diode 165 causing it to conduct in order pull the base of the transistor 160 low causing it to turn off which, in turn, causes the switching transistor 158 to turn off.

The temperature sensor 44, connected between terminals 104 and 106, is applied directly to an ADC port on the microcontroller 62. Thus, when the temperature of the battery cells 32 goes above a predetermined value, the microcontroller 62 can adjust the duty cycle of the PWM signal to its minimum values to avoid damage to the battery cells 32.

In order to reduce power drain on the battery cells 32 during an idle and suspend mode of the microcontroller 62, another switching circuit 62 is connected between the microcontroller 62 analog supply AVCC and the supply voltage. The switching circuit 170 includes a switching transistor 172 and a resistor 174. The switching transistor 172 is under the control of the microcontroller 62. In particular, the gate of the switching transistor 172 is connected to an output port on the microcontroller 62. Thus, during suspend and idle modes of the microcontroller 62, the analog power supply AVCC is disconnected from the system. During a wake-up mode, a logic level signal from the microcontroller 62 is applied to the gate of the switching transistor 172 which, in turn, connects the power supply to the analog source.

The frequency of the microcontroller 62 is regulated by a crystal oscillator and two capacitors 176 and 178. The crystal oscillator 174 and capacitors 176 and 178 are connected to the X1 and X2 terminals of the microcontroller 62.

The output of the battery control circuit 34 is a charge control signal CHG-CNTL. As indicated above, this signal is a variable duty cycle PWM signal provided by PTM circuitry within the microcontroller 62. This CHG-CNTL signal is applied to the circuitry illustrated in FIG. 6A by way of a resistor 175 (FIG. 5A). As will be discussed in detail below, the circuitry illustrated in FIG. 6A modulates the charge control signal as a function of the load demand of the computer system 26 in order to avoid exceeding the capacity of the charger system.

Figure 6A:
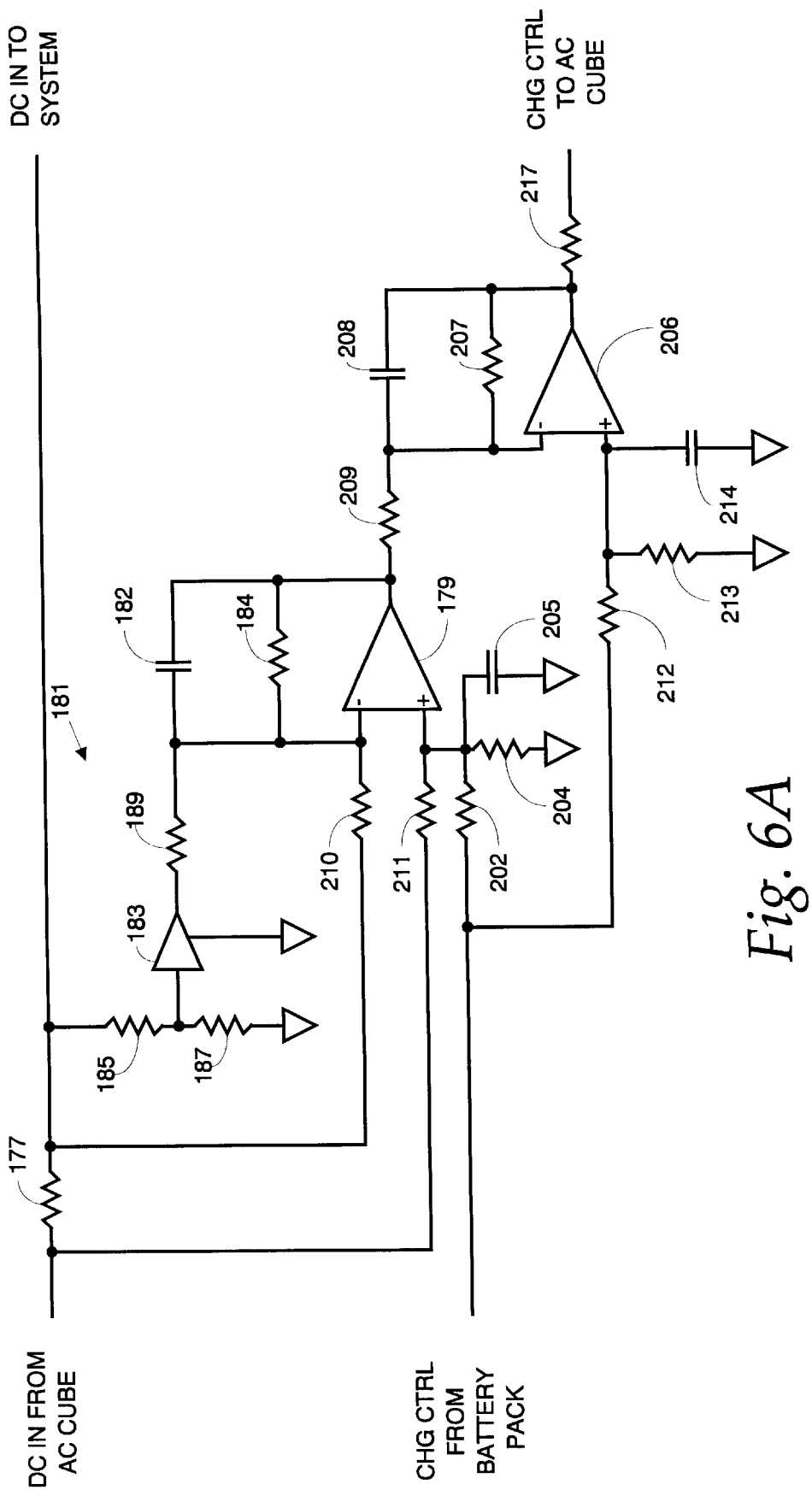
FIG. 6A is an exemplary schematic diagram of a circuit adapted to regulate the charging current as a function of the load demand of the computer system.

A circuit for sensing the load current of the computer system 26 is illustrated in FIG. 6A. This circuit is used to regulate the charge control signal from the battery control circuit 34 to provide for efficient use of the charger 24 capacity. In particular, a current sensing resistor 177 is disposed in series with the line 28 (FIG. 1) in order to sense the current load demand of the computer system 26. The voltage across the current sensing resistor 177 is used to modulate the charge control signal from battery control circuit 34 to avoid exceeding the capacity of the charger 24; thus enabling the residual capacity of the battery charger 24 to be utilized for efficient battery charging during all operating conditions of the computer system.

In particular, the voltage across the current sensing resistor 177 is disposed across a differential amplifier 179 having negative feedback through a feedback capacitor 182 and a feedback resistor 184 by way of a pair of input resistors 210 and 211. In addition, a fixed voltage circuit 181, which outputs a regulated voltage representative of the maximum capacity of the battery charger system 24, is also applied to the inverting input of the differential amplifier 179. This fixed voltage circuit 181 includes a regulator 183, a pair of voltage divider resistors 185 and 187 and an input resistor 189. A voltage representative of the charge control signal from the battery control circuit 34 is connected to the non-inverting input of the differential amplifier 179 by way of a pair of voltage divider resistors 202 and 204 and a capacitor 205 which acts as a low-pass filter for providing the DC value of the PWM signal from the battery control circuit 34.

The output of the differential amplifier 179 is a voltage representative of the charge requested by the battery control circuit 34 in excess of the maximum charger 24 capacity as a function of the current load demand of the computer system 26. This voltage is used to modulate the charge control signal applied to line 29 in FIG. 6B. If the sum of the current demand from the battery control circuit 34 and the load demand of the computer system 26 is less than the maximum capacity of the charger 24, the representative voltage from the differential amplifier 179 is zero. Otherwise, a positive voltage is generated at the output of the differential amplifier 179. The amplitude of this positive voltage is proportional to the excess amount of power being requested by the battery control circuit 34.

The output of the differential amplifier 179 is applied to the inverting input of another differential amplifier 206, having a feedback resistor 207 and a feedback capacitor 208, by way of a resistor 209. The charge control signal from the battery control circuit 34 is applied to a non-inverting input of the differential amplifier 206 by way of a pair of voltage divider resistors 212 and 213. A bypass capacitor 214 is also connected to the non-inverting input of the differential amplifier 206. The output of the differential amplifier 206 is connected to the CONTROL signal line 29, FIG. 6B, by way of a resistor 217.

The differential amplifier 206 is thus used to modulate the charge control signal from the battery control circuit 34 as a function of the current load demand of the computer system 26. In particular, if the sum of the current load demand of the computer system 26, as sensed by the load sensing resistor 177, and the current charge demand of the from the battery control circuit 34 exceed the maximum capacity of the charger system 24, the excess amount is subtracted from the charge control signal by way of the differential amplifier 206. As such, the maximum capacity of the charger system 24 is able to be utilized to enable optimal charging of the battery pack 22 during all operating conditions of the computer system 26.

Figure 6B:
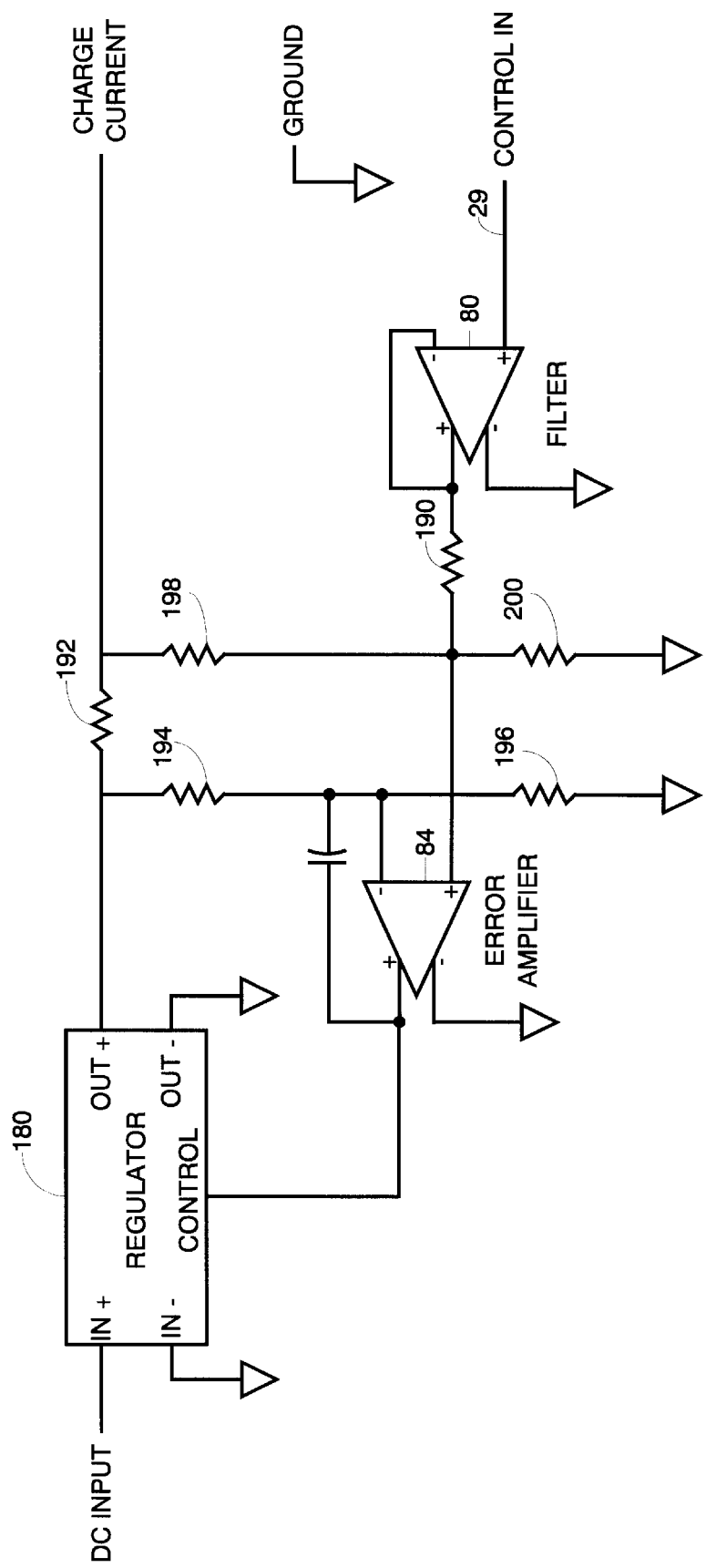
FIG. 6B is an exemplary schematic diagram of the battery charging system illustrated in FIG. 3.

The variable output battery charger system 24 in accordance with the present invention is illustrated in FIG. 6B. As mentioned, the output of the differential amplifier 206 is connected to the CONTROL IN signal (line 29) of the battery charger system 24. The battery charger system 24 includes a constant current regulator 180 that is adapted to receive a DC input. The output of the regulator 180 is a variable charging current used to charge the battery cells 32. As discussed above, the battery charging circuitry is controlled by the regulated charge control signal from the circuitry illustrated in FIG. 6A. This signal applied to a non-inverting input of the amplifier 80 and, in turn to an error amplifier 84 by way of a coupling resistor 190. A sensing resistor 192 is used to sense the charging current provided by the battery charger 24. The voltage drop across the current sensing resistor 192 is applied to the error amplifier by way of voltage dividers formed by the resistor 194–200. The output of the error amplifier 84, in turn, is used to control the current output from the regulator in order to provide a variable output charge current to the battery cells as discussed above.

Figure 7:
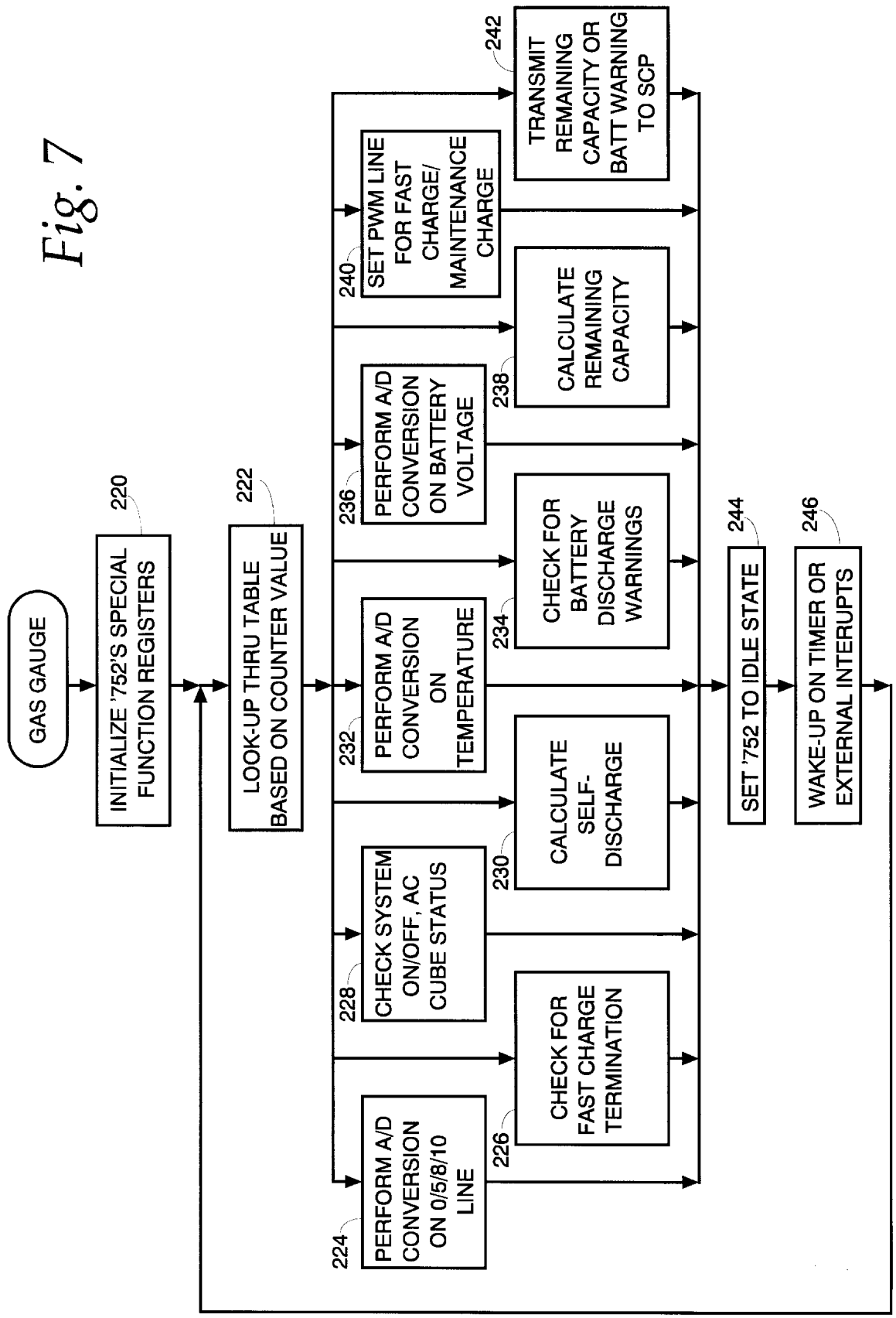

The flow diagrams for controlling operation of the computer power supply system 20 are illustrated in FIGS. 7–19. FIG. 7 represents the main loop, while FIGS. 8–19 represent various subroutines for performing various functions in the system 20. Referring to FIG. 7, the system is initialized in step 220. In particular, in this step the special function registers on board the microcontroller 62 are initialized. After the special function registers have been initialized, the system proceeds to step 222. In step 222, one of nine tasks or operations identified as steps 224–242 are scheduled. These tasks 224–242 are identified in a look-up table and are scheduled according to a timing sequence. Once the specific task has been scheduled, the task is executed. After the selected task 224–242 has been executed, the microcontroller 62 is set to an idle state in step 244. The microcontroller 62 will remain in the idle state until a wake-up, based on a timer or other external interrupt in step 246. After a wake-up of the microcontroller 62, the system then proceeds back to step 222 in order to obtain the next sequence value.

The subroutines for performing each of the tasks identified with the reference numerals 224–242 in FIG. 7 are illustrated in FIGS. 8–19. Referring to FIGS. 8–10, these figures illustrate subroutines for the tasks identified with the reference numerals 224, 232 and 236, respectively. Each of these subroutines, 224, 232 and 236 relate to performing an A/D conversion utilizing the on-board A/D converter on the microcontroller 62. FIG. 8 relates to performing an A/D conversion of the system status line 8–10 V, illustrated in FIG. 5A. Initially, in step 244, the on-board A/D converter is enabled for the system status line. After the A/D conversion is performed, the A/D value is read and stored in step 246.

In FIG. 9, the subroutine for converting the battery temperature is illustrated. This subroutine relates to task 232, identified in FIG. 7. Initially, in step 248, the A/D converter on board the microcontroller 62 is enabled for temperature conversion. After the temperature value is converted, it is read and stored in step 250.

FIG. 10 relates to an A/D conversion of the battery voltage. This figure corresponds to task 236, identified in FIG. 7. Similar to FIGS. 8 and 9, the A/D conversion process for the battery voltage is initiated by enabling the on-board A/D converter in step 252. Once the battery voltage value is converted, it is read and stored in step 254.

The system status (e.g., line 8–10 V, FIG. 5A) is checked by the system status subroutine illustrated in FIG. 11. This subroutine is identified as task 228 in FIG. 7. This subroutine 228 is used to determine the status of the computer system 26, the battery pack 22 and the battery charger system 24. In particular, the subroutine 228 identifies whether the battery pack 22 and the battery charger 34 have been connected to the system as well as the on-off status of the computer system 26 and battery charger 24. The status of the battery charger system 24 as well as the computer system 26 is determined by comparing the converted A/D value from the subroutine 224 with various predetermined reference set points, selected to indicate the status of the 8–10 V line as discussed above. Initially, in step 256, the A/D system value is compared with a reference value 9.0 volts. If the AD SYS VAL is greater than 9.0 volts, the system indicates that the battery charger system is on and the computer system 26 is off in step 258. This state allows the battery pack 22 to be charged at a fast charge rate. If the AD SYS VAL is not greater than 9.0 volts, the system checks in step 260 to see if this variable is greater than 7.0 volts. If so, the system indicates in step 262 that the battery charger system 24, as well as the computer system 26 are both on in step 262 which indicates that the battery pack 22 can not be fast charged. If the AD SYS VAL is not greater than 70, the system checks in step 264 to determine if the variable is greater than 3.0 volts. If so, the system indicates in step 266 that the battery charger system is off and the computer system is on in step 266 which indicates that the computer system 26 is being powered solely from the battery pack 22. If the AD SYS VAL is not greater than 3.0 volts, the system indicates in step 268 that the battery pack 22 is hot connected to the system.

Figure 12:
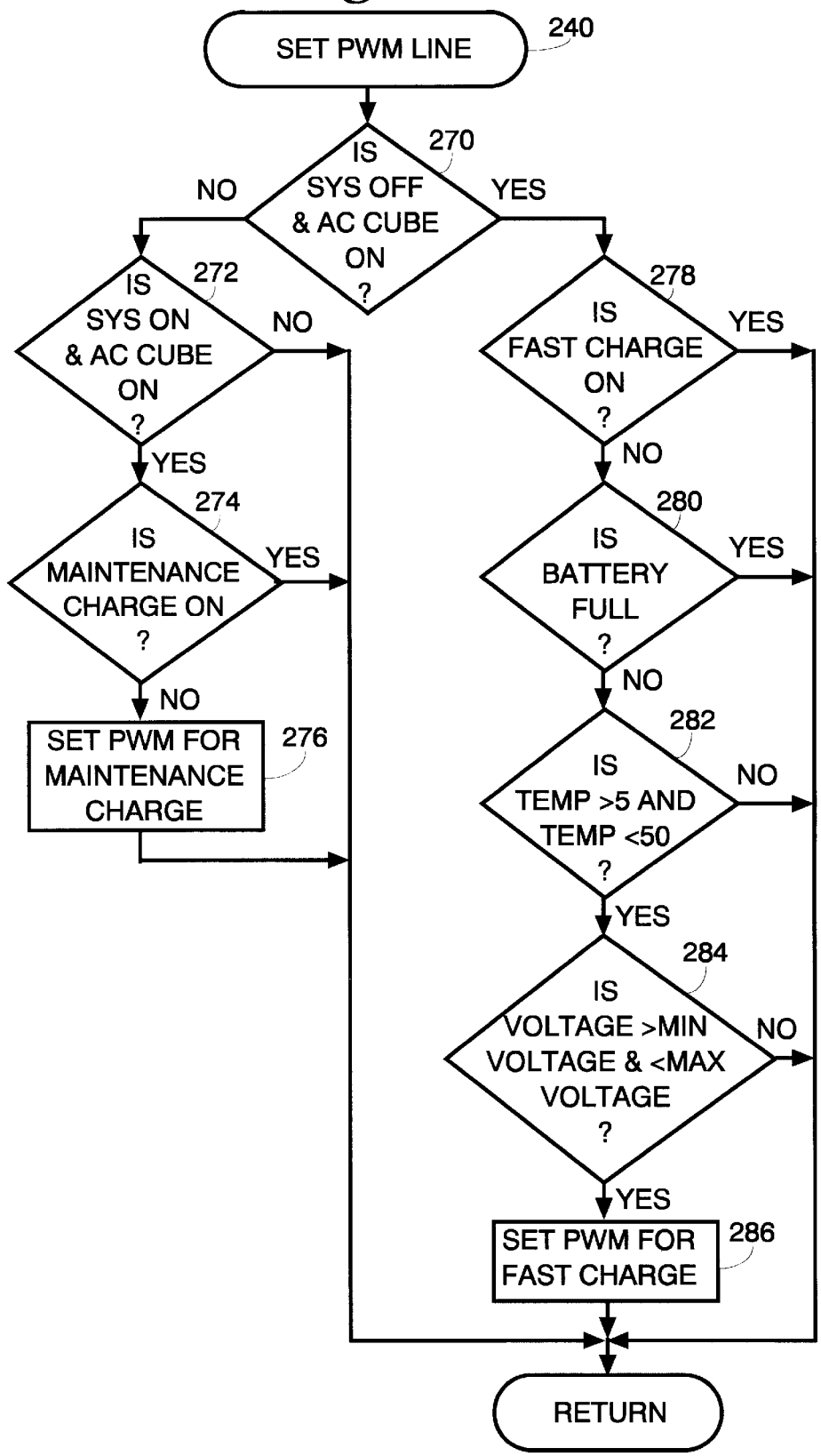

FIG. 12 illustrates a subroutine for setting the PWM line in the microcontroller 62. This subroutine corresponds to the task 240 in FIG. 7. Initially, the system determines in step 270 whether the computer system 26 is off and the battery charger system 24 is on. This information is available from the CHK SYS STATUS subroutine 228 illustrated in FIG. 11. If not, the system proceeds to step 272 to determine if the computer system 26 is on and the battery charger system 24 is on in step 272. If so, this indicates that the computer system 26 is being powered by the battery charger system 24. In such a condition, the system proceeds to step 274 to determine if a maintenance charge is being applied to the battery pack 22. If so, the system proceeds to the return. If not, the system sets the PWM on board the microcontroller 62 for a maintenance charge in step 276. If the system status indicates that the computer system 26 and the battery charger system 24 are not on in step 272, indicating that the battery charger system 24 is not on, the system proceeds to return since a maintenance charge for the battery pack 22 is not viable when the battery charger system 24 is off.

If it is determined that the computer system 26 is off while the battery charger system 24 is on, the battery cells 32 can be fast charged. Thus, the system proceeds to step 278 to determine if the battery cells are being fast charged in step 278. If so, the system returns. If not, the system proceeds to step 280 to determine if the battery is at full capacity. If so, the system returns. If not, the battery temperature is checked in step 282 to determine whether it is within acceptable limits to avoid any damage to the battery cells 32. If not, the system returns. If so, the system proceeds to step 284 to determine whether the battery voltage is within acceptable limits in step 284. If not, the system returns. If so, the duty cycle of the PWM is set for fast charging in step 286.

Fast charging of the battery pack 22 is monitored by the CHECK FC TERM subroutine illustrated in FIG. 13. This subroutine is identified as task 226 in FIG. 7. It is used to determine if fast charge status has been terminated. More particularly, the duty cycle of the on-board PWM is set for fast charge any time the computer system 26 is off when the battery charging system 24 is connected in order to charge the battery pack 22 as quickly as possible. Initially in steps 288 and 290, the ratio of Δ temperature/Δ time is checked to determine if it is within acceptable limits. If not, the system indicates in step 292 that the battery capacity is 100% in step 292. A such, the fast charging is terminated in step 294 by setting the duty cycle of the PWM signal to zero. If the ratio Δ temperature/Δ time is satisfactory, the battery voltage is then checked in step 296 to determine whether it is within acceptable limits. If not, the system proceeds to step 294 and terminates fast charging. If so, the system proceeds to step 298 to determine whether the battery temperature is within acceptable limits to avoid overheating and damage to the battery pack 22. If not, the system proceeds to step 294 to terminate fast charging. If so, the system proceeds to step 300 where the ratio Δ voltage/Δ time is checked. If the ratio of Δ voltage/Δ time is acceptable, the system returns. If not, the fast charging is terminated in step 294.

The subroutine in FIG. 14 calculates the selfdischarge of the battery pack. This subroutine corresponds to task 230 illustrated in FIG. 7. Initially, the system checks in step 302 to determine if the microcontroller 62 is in a suspend mode. If so, the SUSPEND DISCHARGE VALUE is set in step 304. If not, the system proceeds to step 306 where the system determines if the microcontroller 62 is in the standby mode. If so, the system proceeds to step 308 and sets the STAND-BY DISCHARGE VALUE. If the system is neither in the suspend mode or stand-by mode, the battery pack hardware discharge value is set in step 310. This subroutine 230 is used to reduce the power drain on the battery pack 22 during conditions when the microcontroller 62 is in either a suspend mode or a stand-by mode.

Figure 15:
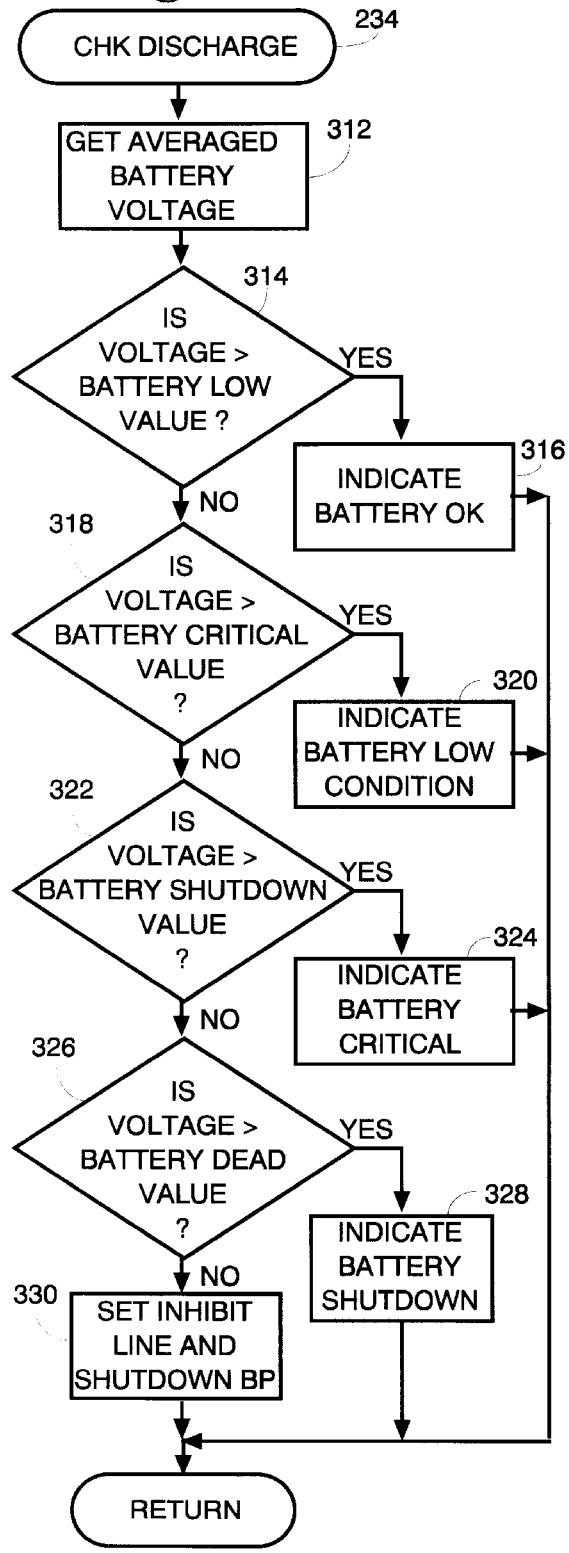

FIG. 15 illustrates a subroutine for checking the system for battery discharge warnings. This subroutine corresponds to task 234 illustrated in FIG. 7. Initially, the battery voltage is averaged in step 312. The averaged battery voltage is then compared with a first predetermined value representative of a pre-selected battery-low value in step 314. If the averaged battery voltage is greater than the battery-low voltage, the system indicates that the battery is OK in step 316. If not, the system then checks in step 318 to determine whether the voltage is greater than a battery critical value. If so, the system indicates a battery low condition in step 320. If not, the voltage is then compared with a battery shut-down value in step 322. If the voltage is greater than the battery shut-down voltage, the system indicates in step 324 that the battery is critical. If the voltage is less than the battery shut-down value, the system proceeds to step 326 where the averaged battery voltage is compared with the battery dead value. If the averaged battery voltage is greater than the battery dead value, the system indicates a battery shut down in step 328. If not, the INHIBIT line is set and the battery pack 22 is shut down in step 330.

Figure 16:
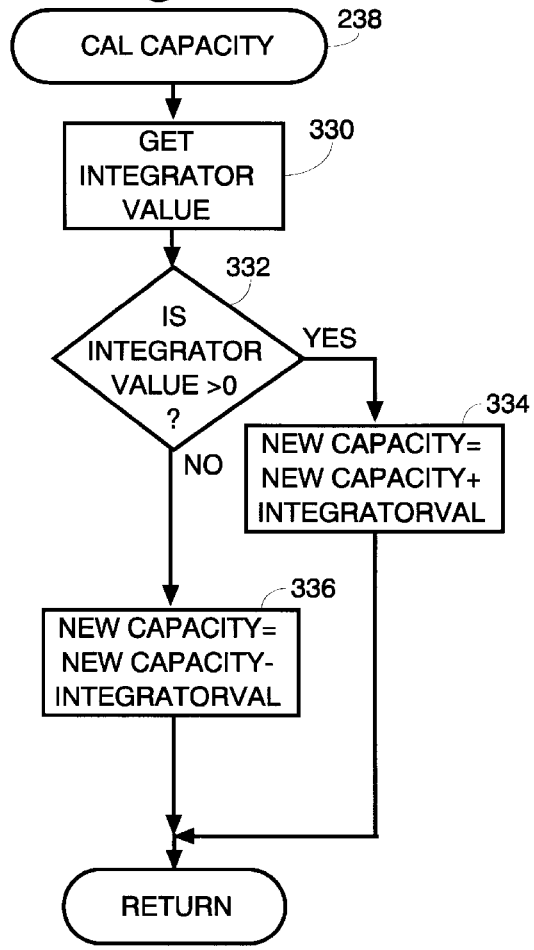

The subroutine illustrated in FIG. 16 is used to determine the remaining capacity of the battery pack 22. This subroutine corresponds to task 238 illustrated in FIG. 7. This subroutine operates on the principal of measuring the current load demand of the computer system 26 as sensed by the current sensing resistor 48 to determine the remaining capacity of the battery charger system 24. Initially, in step 330, the integrator value from the dual-slope off-chip ADC 110 is obtained. The system then determines whether the integrator value is positive in step 332. If the integrator value is positive, the new capacity is determined by adding the integrator value obtained in step 330 to the previous NEW CAPACITY value in step 334. If the integrator value is negative, the integrator value is subtracted from the capacitor in step 336.

Figure 17:
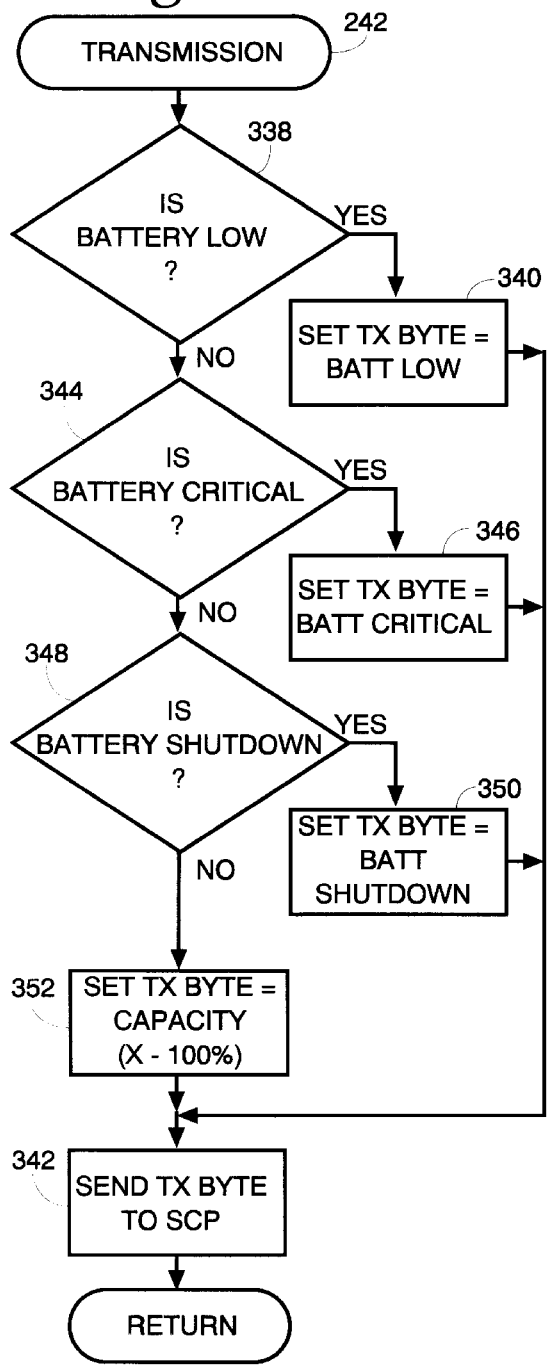

The subroutine illustrated in FIG. 17 is used to check for battery discharge warnings. In particular, this subroutine corresponds to task 242 illustrated in FIG. 7. The battery levels discussed below are obtained from the CHK DISCHARGE subroutine 234 illustrated in FIG. 15. This subroutine is utilized to transmit battery status condition information to the system control processor (SCP) located within the computer system 26. Initially, the system determines if the battery is low in step 338. If so, the TX BYTE=BATT LOW is set in step 340 which, in turn, is sent to the SCP in step 342. If the battery condition is determined not to be low, the system checks in step 344 to determine if the battery pack 22 is at a critical level. If so, the TX BYTE=BATT CRITICAL is set in step 346 and sent to the SCP in step 342. If the battery condition is not critical, the system checks in step 348 to determine if the battery pack 22 is at a shut down level. If so, the TX BYTE=BATT SHUTDOWN is set in step 350 and sent to the SCP in step 342. If the battery is not at the shut down level, the system proceeds to step 352 where the TX BYTE CAPACITY is set in step 352 and ultimately sent to the SCP in step 342.

Figure 18:
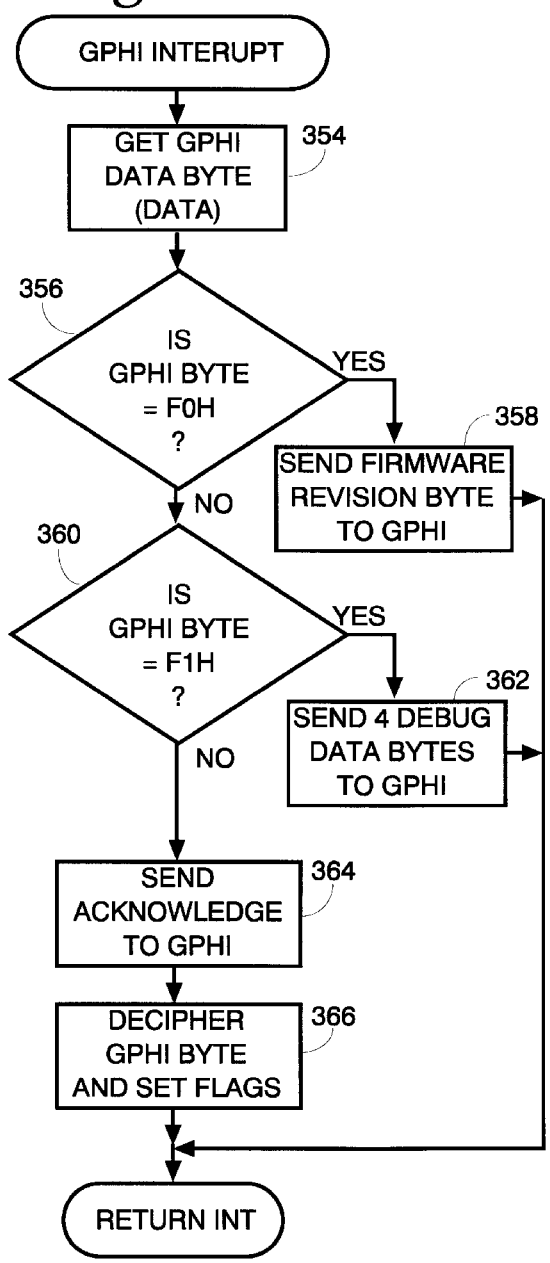

FIG. 18 relates to a subroutine for communication between the microcontroller 62 and a general-purpose hardware interrupt (GPHI), located in the computer system 26. Initiazlly in step 354, the GPHI data byte is obtained from the computer system 26. Subsequently, in step 356, the system decodes the GPHI data byte. If the data byte corresponds to F0h, a firmware revision byte is set to the GPHI in step 358. If the GPHI byte is other than F0h and, in particular, if the system determines in step 360 that the GPHI byte is F1h, four debug data bytes are sent to the GPHI in step 362. If not, an acknowledge is sent to the GPHI in step 364. Subsequently, in step 366, the GPHI byte is decoded and the various flags are set.

Figure 19:
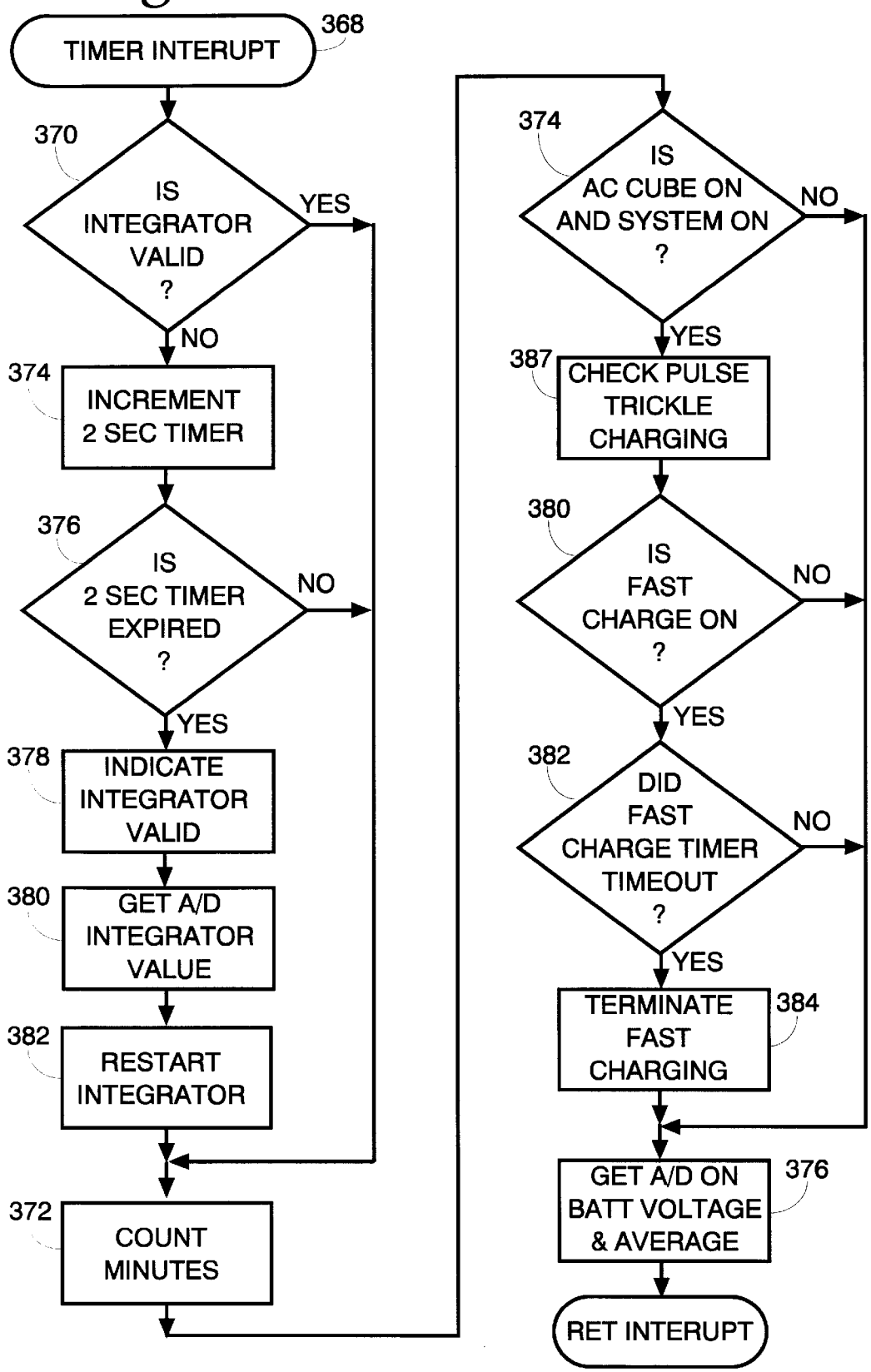

FIG. 19 illustrates a timer interrupt routine for controlling the dual slope A/D converter for converting the voltage across the current sensing resistor 48 to a digital value. This subroutine is identified with the reference numeral 368 and begins in step 370 by determining if the integrator 110 is valid. If the integrator 110 is determined to be valid, the system proceeds to step 372. The validity of the integrator 110 is determined by checking the internal timer used to control the dual-slope integration. If the integrator 110 is determined to not be valid, the two second timer is incremented in step 374. Subsequently, the system checks in step 376 to determine if the two second timer has expired. If not, the system proceeds to step 372. If so, the system indicates that the integrator 110 is valid in step 378 and proceeds to step 380 to get the integrator value. After the integrator value is obtained in step 380, the integrator 110 is restarted in step 382. The system then proceeds to step 372 where the system initiates counting of minutes in order to ensure that the fast charging is limited to a predetermined number of minutes to avoid overheating and damage to the battery pack 22. Subsequently, the system proceeds to step 374 to determine if the computer power system 26 and battery charger system 24 are both on in step 374. If not, the system proceeds to step 376. If so, the duty cycle of the pulse width modulated signal is checked to determine if it is set at a trickle charge rate in step 378. Subsequently, the system proceeds to step 380 to determine if the battery pack 22 is being fast charged. If not, the system proceeds to step 376. If so, the system checks in step 382 to determine if the fast charge timer has timed out. If not, the system proceeds to step 376. If so, the fast charging is terminated in step 384.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A circuit for providing a signal representative of the capacity of a battery, the circuit comprising:
   means for sensing the electrical current supplied from a battery in a predetermined circuit;
   means for integrating said electrical current for a predetermined amount of time, said integrating means including means for resetting said integrating means;
   means for determining the elapsed time for said resetting means to reset said integrating means; and
   means responsive to said time determining means for providing a signal representative of the capacity of the battery.

2. A circuit as recited in claim 1, wherein said sensing means includes means for providing an electrical voltage signal representative of the current being supplied from the battery.

3. A circuit as recited in claim 1, wherein said predetermined circuit includes said battery disposed in a parallel configuration with a predetermined load and a source of AC electrical power.

4. A circuit as recited in claim 1, wherein said integrating means and said determining means form an analog to digital converter (ADC) electrically coupled to said sensing means for providing a digital representation of said battery current.

5. A circuit as recited in claim 4, wherein said providing means further includes means for comparing the output of said ADC with a predetermined reference voltage which switches states as a function of whether said ADC output voltage is more or less than said predetermined reference voltage.

6. A circuit for providing a signal representative of the capacity of a battery, the circuit comprising:
   means for sensing the electrical current supplied from a battery in a predetermined circuit; and
   means responsive to said sensing means for providing a signal representative of the capacity of the battery, said sensing means includes means for providing an electrical voltage signal representative of the current being supplied from the battery, said electrical voltage signal providing means includes a predetermined analog to digital converter (ADC) electrically coupled to said sensing means for providing a digital representation of said battery circuit, said predetermined ADC being a dual slope ADC having an inverting input and a non-inverting input, said digital representation providing means including means for comparing the output of said ADC with a predetermined reference voltage which switches states as a function of whether said ADC output voltage is more or less than said predetermined reference voltage.

7. A circuit as recited in claim 6, further including means for selectively switching the signals applied to said inverting terminal and said non-inverting terminal.

8. A circuit as recited in claim 7, wherein said switching means includes first and second electronic switches electrically coupled to one of said inverting and non-inverting terminals, and a third electronic switch electronically coupled to the other of said inverting and non-inverting terminals.

9. A circuit as recited in claim 8, wherein said battery current representative signal is electrically coupled to said first electronic switch and a first predetermined reference voltage is applied to said second electronic switch and a second predetermined reference voltage is applied to said third electronic switch.

10. A circuit as recited in claim 9, further including means for selectively actuating said first, second and third electronic switches.

11. A circuit as recited in claim 6, wherein said predetermined ADC includes an integrator which includes an operational amplifier having a predetermined offset voltage.

12. A circuit as recited in claim 11, further including means for correcting said offset voltage.

13. A circuit as recited in claim 12, wherein said correcting means includes means for actuating said third electronic switch and connecting one of said inverting or non-inverting terminals to said second predetermined reference voltage for a predetermined time period.

14. A circuit as recited in claim 13, wherein said second predetermined reference voltage is ground.

15. A circuit as recited in claim 14, wherein said correcting means further includes for subsequently actuating said first electronic and connection the other of said inverting or non-inverting terminals to a first predetermined voltage until said comparing means switches states to provide a signal representative of the offset voltage.

16. A circuit as recited in claim 15 wherein said providing means includes for subsequently actuating said second electronic switch thereby connecting said battery current representative signal to one of said inverting or non-inverting terminals for a predetermined time period and subsequently de-activating said second electronic switch after said predetermined time period and actuating said first electronic switch thereby connecting one of said inverting or non-inverting terminals to said first predetermined reference voltage until said comparing means switches states and means for determining the time period for said comparing means to switch states to provide a signal representative of the battery current.

17. A circuit for determining the remaining capacity of a battery, the circuit comprising:
   means sensing the current supplied by said battery and providing a signal representative of the battery current;
   means responsive to said providing means for generating a signal representative of the remaining capacity of said battery, said generating means including means for converting said battery current representative signal to a digital value, said converting means including a predetermined dual slope analog to digital converter.

18. A circuit as recited in claim 17, wherein said generating means includes means for accumulating the battery current representative signal.

19. A circuit as recited in claim 17, wherein said accumulating means includes means for providing the remaining battery capacity.

20. A circuit as recited in claim 18, wherein said accumulating means includes means for converting said battery current representative signal to a digital value.

21. A circuit for determining the remaining capacity of a battery, the circuit comprising:
   means sensing the current supplied by said battery and providing a signal representative of the battery current;
   means responsive to said providing means for generating a signal representative of the remaining capacity of said battery, said generating means including means for accumulating the battery current representative signal, said accumulating means including means for converting said battery current representative signal to a digital value, said converting means includes a predetermined analog to digital converter (ADC), said predetermined ADC being a dual slope ADC with an inverting input and a non-inverting input.

22. A circuit as recited in claim 21, further including means for switching the signals applied to said inverting and non-inverting inputs.

23. A circuit as recited in claim 22, wherein said switching means includes first and second electronic switches adapted to be selectively coupled to one of said inverting and non-inverting inputs and a third electronic switch adapted to be selectively coupled to the other of said inverting and non-inverting inputs.

24. A computer system comprising:
   a portable personal computer
   means for providing a portable source of direct current (DC) electrical power to said personal computer;
   means for integrating an electrical voltage for a predetermined amount of time, said integrating means including means for integrating a predetermined value having polarity opposite to said direct current until said integrating means is reset;
   means for determining the elapsed time for said integrating means to integrate from said predetermined value to reset; and
   means responsive to said elapsed time for generating a signal representative of the remaining capacity of said portable source of DC power.

25. A computer system as recited in claim 24, wherein said generating means includes means for sensing the electrical current supplied by said source of portable DC electrical power.

26. A computer system as recited in claim 25, wherein said generating means includes means for accumulating the current supplied by said battery.

27. A method for determining the remaining capacity of a battery, the method comprising the steps of:

(a) sensing the current supplied by the battery;

(b) integrating said current for a predetermined amount of time and then integrating a predetermined value until said integrated value is zero;

(c) determining the elapsed time for said integrating step to integrate from said predetermined value to zero; and (d) determining the remaining capacity of the battery based on said elapsed time.

* * * * *

UNITED STATES PATENT AND TRADEMARK OFFICE
CERTIFICATE OF CORRECTION

PATENT NO. : 5,883,497
DATED : March 16, 1999
INVENTOR(S) : Turnbull It is certified that error appears in the above-identified patent and that said Letters Patent is hereby corrected as shown below:

Column 15, line 60; after "includes" insert --means-- therefor.

Column 15, line 62; change "connection" to --connecting-- therefor.

Signed and Sealed this

Twenty-eighth Day of September, 1999

Attest:

Q. TODD DICKINSON

*Attesting Officer*     *Acting Commissioner of Patents and Trademarks*